(12) United States Patent
Kornmeier et al.

(10) Patent No.: US 11,403,310 B2
(45) Date of Patent: Aug. 2, 2022

(54) SYSTEMS AND METHODS FOR ENHANCING TIME SERIES DATA COMPRESSION FOR IMPROVED DATA STORAGE

(71) Applicant: Verizon Patent and Licensing Inc., Arlington, VA (US)

(72) Inventors: Benjamin E. Kornmeier, Denver, CO (US); Richard L. Welch, Boulder, CO (US); Christopher D. Bynum, Denver, CO (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 170 days.

(21) Appl. No.: 16/805,553

(22) Filed: Feb. 28, 2020

(65) Prior Publication Data
US 2021/0271675 A1 Sep. 2, 2021

(51) Int. Cl.
*G06F 7/00* (2006.01)
*G06F 16/2458* (2019.01)
*G06N 7/00* (2006.01)
*G06F 16/22* (2019.01)
*G06N 20/00* (2019.01)

(52) U.S. Cl.
CPC ...... *G06F 16/2474* (2019.01); *G06F 16/2272* (2019.01); *G06N 7/00* (2013.01); *G06N 20/00* (2019.01)

(58) Field of Classification Search
CPC ............ G06F 16/2474; G06F 16/2272; G06F 16/2477; G06N 7/00; G06N 20/00; H03M 7/3059; H03M 7/70
See application file for complete search history.

(56) References Cited

U.S. PATENT DOCUMENTS

| 5,264,848 | A  | * | 11/1993 | McGuffin | H03M 7/30 341/51 |
| 7,565,681 | B2 | * | 7/2009 | Ngo | H04N 7/17336 725/101 |
| 9,137,336 | B1 | * | 9/2015 | Zalunin | H03M 7/30 |
| 9,195,700 | B1 | * | 11/2015 | Becker | G06F 16/24565 |
| 9,396,287 | B1 | * | 7/2016 | Bhave | G06F 11/3072 |
| 10,621,141 | B2 | * | 4/2020 | Gross | G06F 16/2453 |
| 2009/0216787 | A1 | * | 8/2009 | Wang | G06F 16/2264 |
| 2010/0027625 | A1 | * | 2/2010 | Wik | G10L 19/002 375/240.12 |
| 2012/0330931 | A1 | * | 12/2012 | Nakano | G06F 16/2474 707/722 |

(Continued)

OTHER PUBLICATIONS

Pelkonen et al., "Gorilla: A fast, scalable, in-memory time series database", 2015.

*Primary Examiner* — Mohammed R Uddin

(57) ABSTRACT

A device may receive, from a source device, original time series data to be stored in a data structure associated with the device, and may sort the original time series data to generate sorted time series data. The device may identify an index for the original time series data based on the sorted time series data. The device may process the sorted time series data, with a regression model, to generate compressed time series data and parameters associated with the compressed time series data. The device may encode the index to generate an encoded index, and may store the encoded index, the compressed time series data, and the parameters in the data structure.

24 Claims, 17 Drawing Sheets

(56) References Cited

U.S. PATENT DOCUMENTS

| | | | |
|---|---|---|---|
| 2014/0052701 A1* | 2/2014 | Olmino | G06F 16/1744 |
| | | | 707/693 |
| 2016/0099723 A1* | 4/2016 | Kletter | H03M 7/3088 |
| | | | 341/51 |
| 2016/0282941 A1* | 9/2016 | Aksenova | A61B 5/7203 |
| 2016/0321323 A1* | 11/2016 | Gaumnitz | G06F 16/2272 |
| 2017/0017368 A1* | 1/2017 | Maheshwari | G06F 3/0484 |
| 2019/0095488 A1* | 3/2019 | Bhattacharjee | G06F 16/2228 |
| 2019/0108669 A1* | 4/2019 | Burgett | G06T 13/80 |
| 2019/0251764 A1* | 8/2019 | Wang | G06F 16/22 |

\* cited by examiner

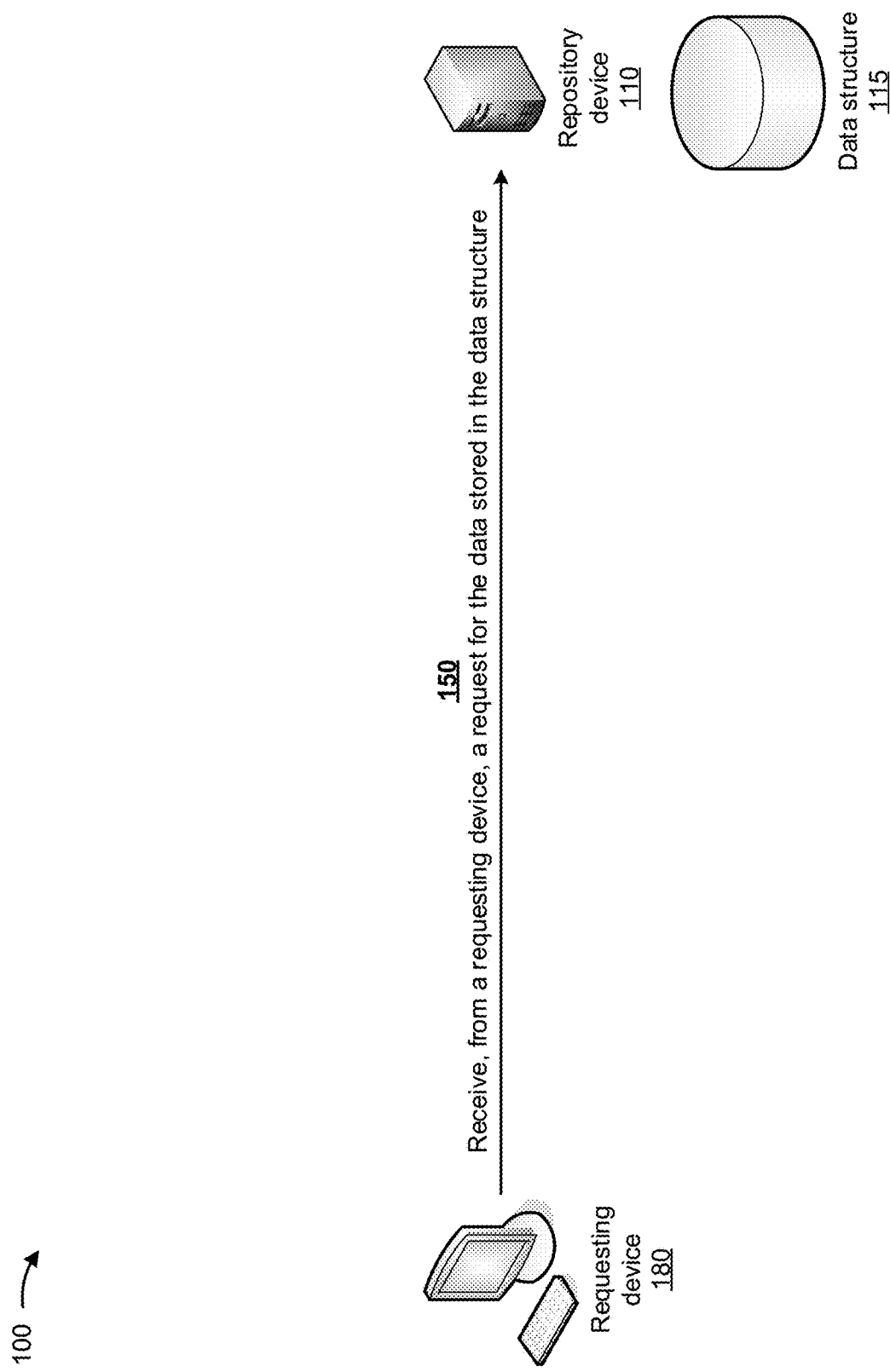

SYSTEMS AND METHODS FOR ENHANCING TIME SERIES DATA COMPRESSION FOR IMPROVED DATA STORAGE

BACKGROUND

An important requirement to operating large scale computing system services, such as network security services, social media services, video services, and/or the like, is to accurately monitor (e.g., with a monitoring system) a health and a performance of an underlying system and quickly identify and diagnose problems as problems arise. A data structure (e.g., a database) may be used to store system data points generated over a period of time (sometimes referred to as "time series" data) and to provide quick query functionalities. Such a monitoring system may generate high volumes of time series data in large scale systems—for example, hundreds of reporting sources may generate millions of data points per second and over one trillion data points per day.

DETAILED DESCRIPTION OF PREFERRED EMBODIMENTS

Figure 1A:
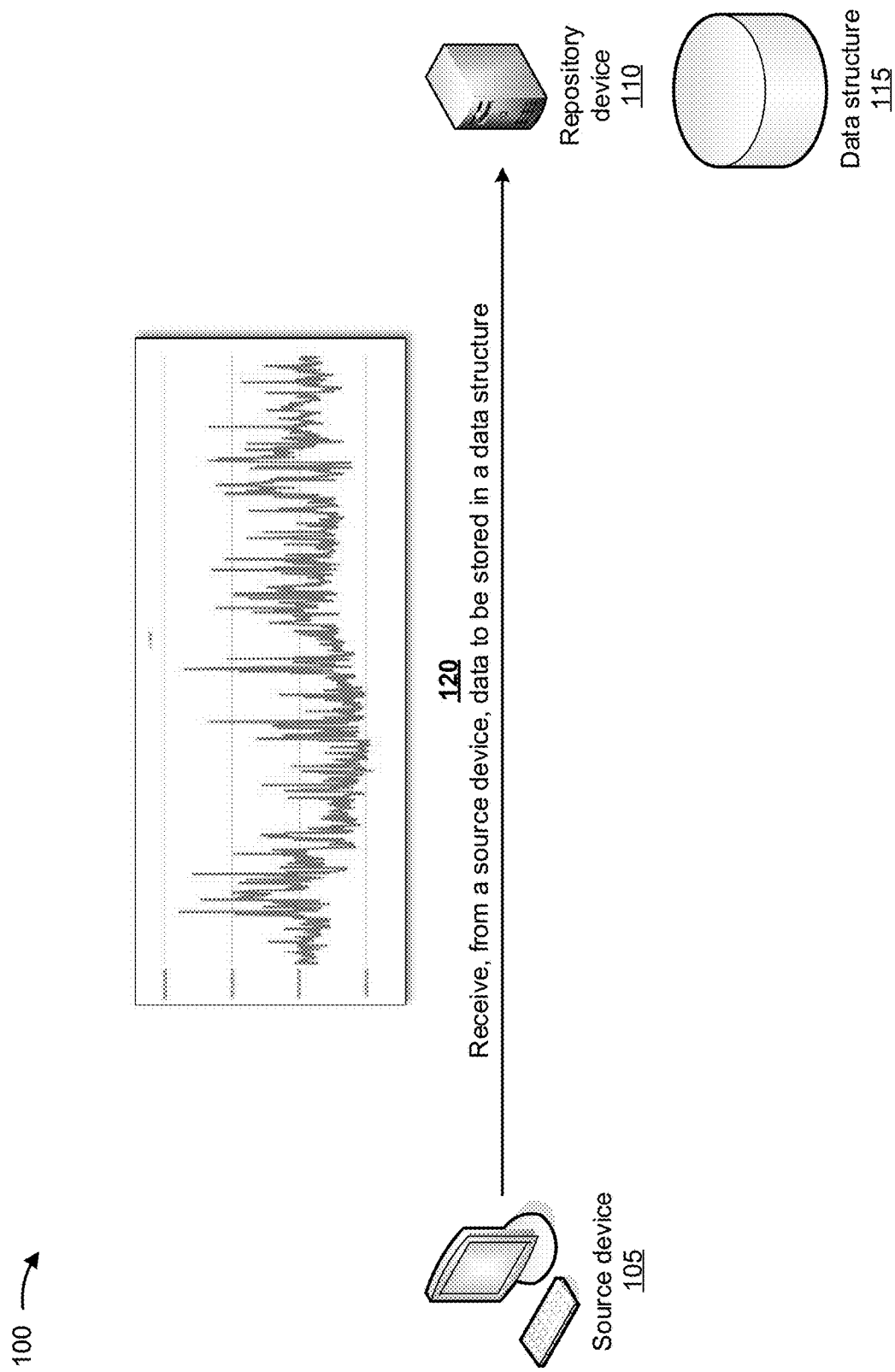
FIGS. 1A-1N are diagrams of one or more example implementations described herein.

The following detailed description of example implementations refers to the accompanying drawings. The same reference numbers in different drawings may identify the same or similar elements.

Since a monitoring system may generate millions, billions, trillions, and/or the like of time series data points per day, the data points may be compressed before being stored in a data structure. Time series data (e.g., sensor data, social media data, network data, and/or the like) may include values that are different from interval to interval. Current time series compression techniques focus on smaller intervals (e.g., in seconds, milliseconds, and/or the like), and rely upon "delta compression" to eliminate bits from the data (e.g., to compress the data). However, if the intervals are larger (e.g., in minutes, hours, and/or the like), the sequential values may be highly variable, which will make delta compression not as effective for eliminating bits from the data and for compressing the data. Furthermore, current time series compression techniques (such as delta compression) require storage of data points in an order that the data points are received, which prevents the use of techniques that increase compression efficiency. Thus, current time series compression techniques waste computing resources (e.g., processing resources, memory resources, communication resources), networking resources, and/or the like associated with storing large quantities of data, processing large quantities of data, and/or the like.

Some implementations described herein provide a device that enhances time series data compression for improved data storage and retrieval. For example, the device may receive time series data to be stored in a data structure associated with the device, and may sort the time series data to generate sorted time series data that is no longer in time series order. The device may identify an index for the time series data based on the sorted time series data. The device may process the sorted time series data, with a regression model to generate compressed time series data and parameters associated with the compressed time series data. The device may encode the index to generate an encoded index, and may store the encoded index, the compressed time series data, and the parameters in the data structure. The device may thereafter receive a request to obtain the time series data. The device may retrieve the encoded index, the compressed time series data and the parameters, decode the encoded index to regenerate the original index, use the compressed time series data and the parameters with the regression model to generate the sorted time series data and use the index to reorder then elements to recreate the original time series data.

In this way, the device enhances time series data compression for improved data storage and retrieval. The device may increase a compression ratio of the data relative to current time series compression techniques, may handle larger time/value intervals associated with data points, may allow for reordering the data points that does not conform to time sequencing, may significantly reduce data storage requirements relative to current time series compression techniques, and/or the like. Thus, the device conserves computing resources (e.g., processing resources, memory resources, communication resources), networking resources, and/or the like that would otherwise have been wasted in storing large quantities of data, retrieving large quantities of data, processing large quantities of data, and/or the like using less efficient techniques.

Figure 1B:
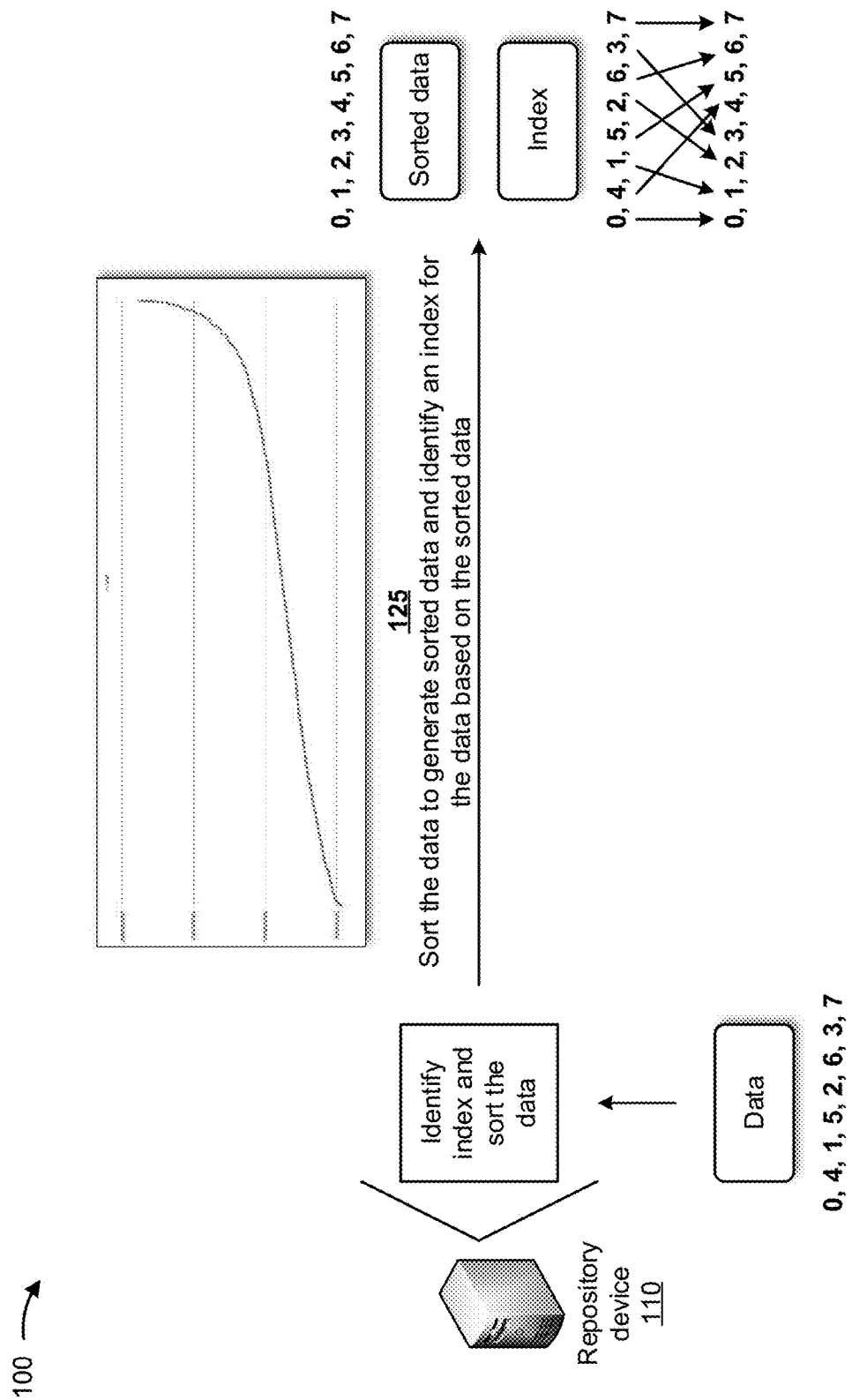
Figure 1C:
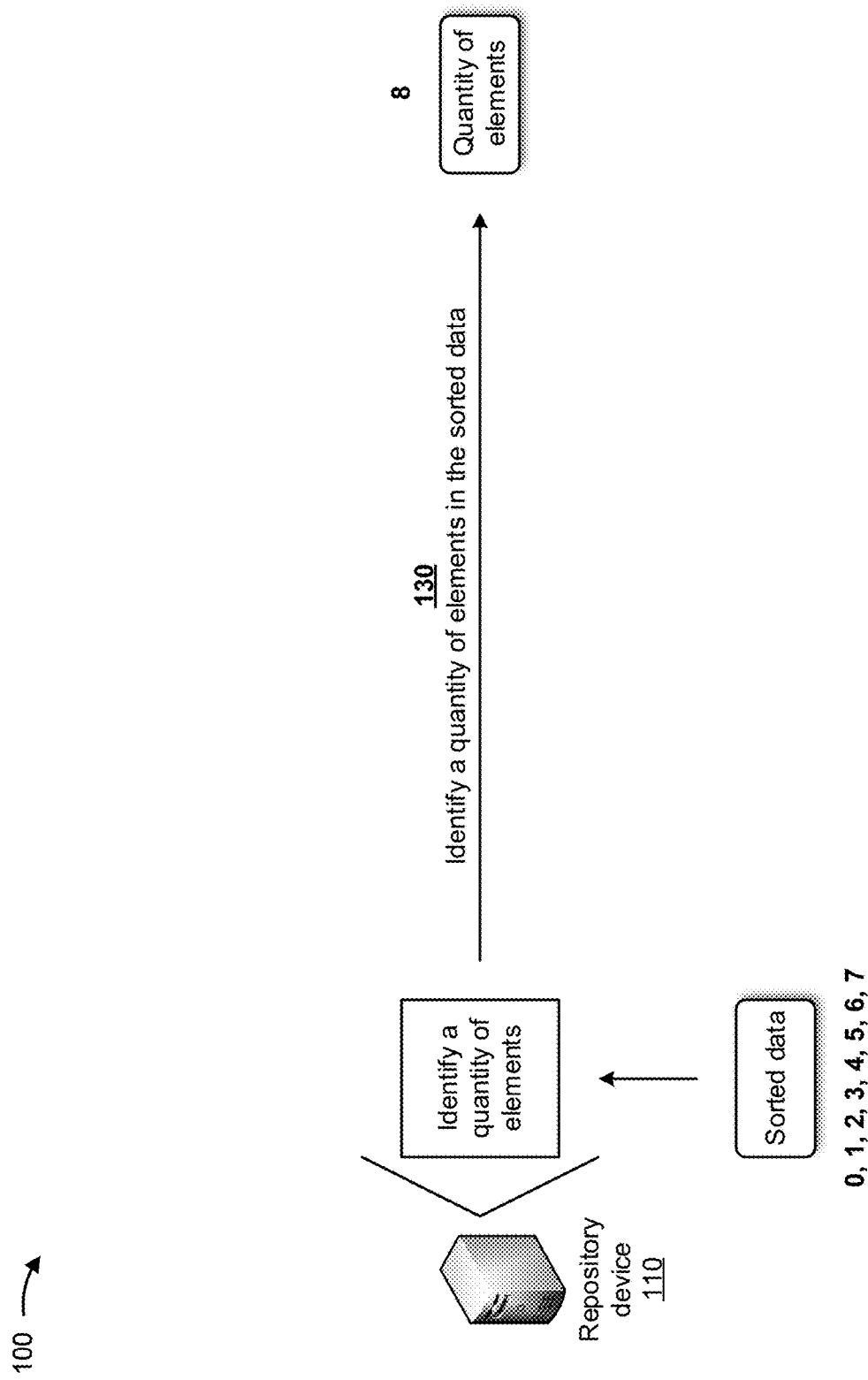
Figure 1D:
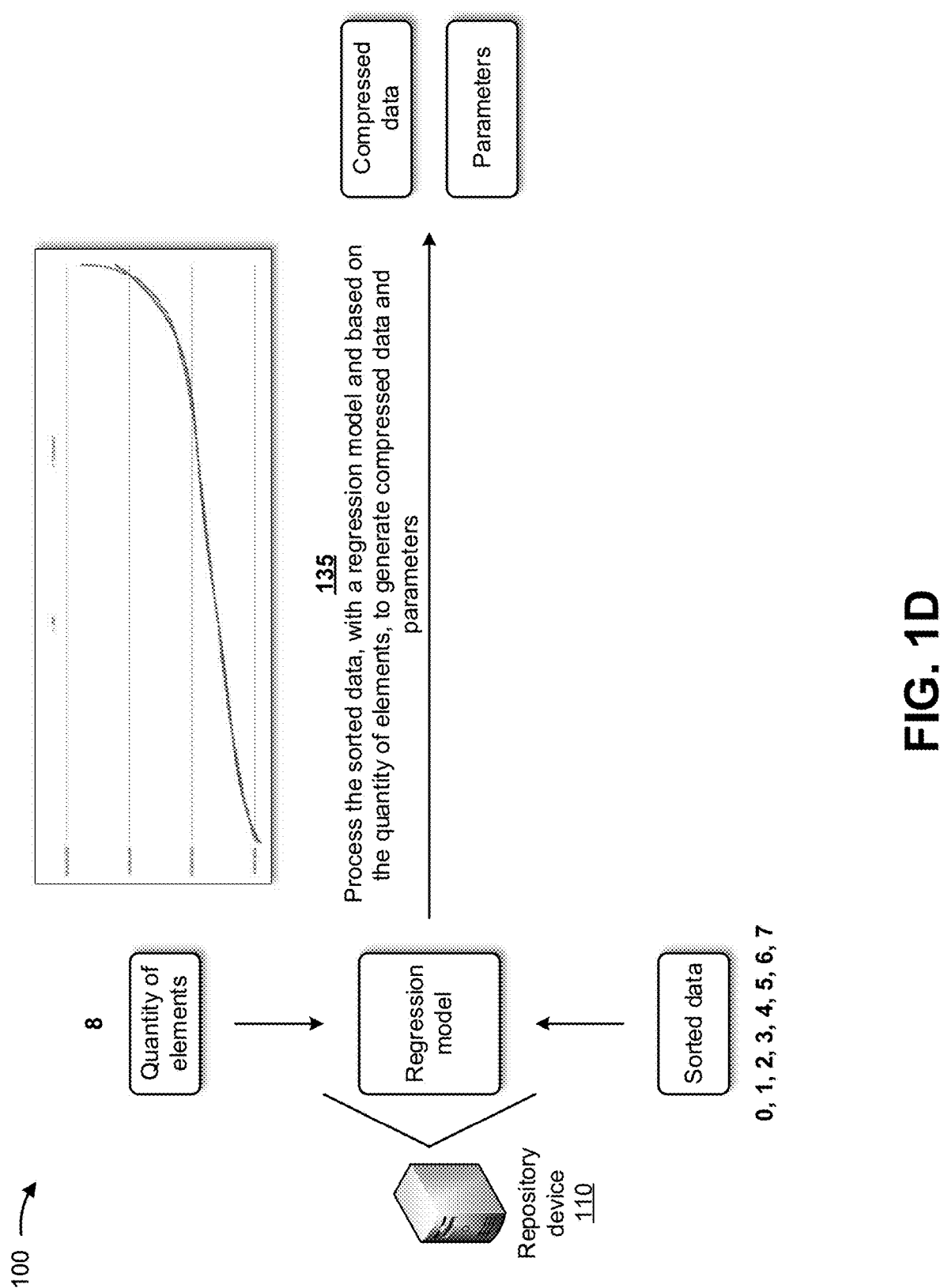
Figure 1E:
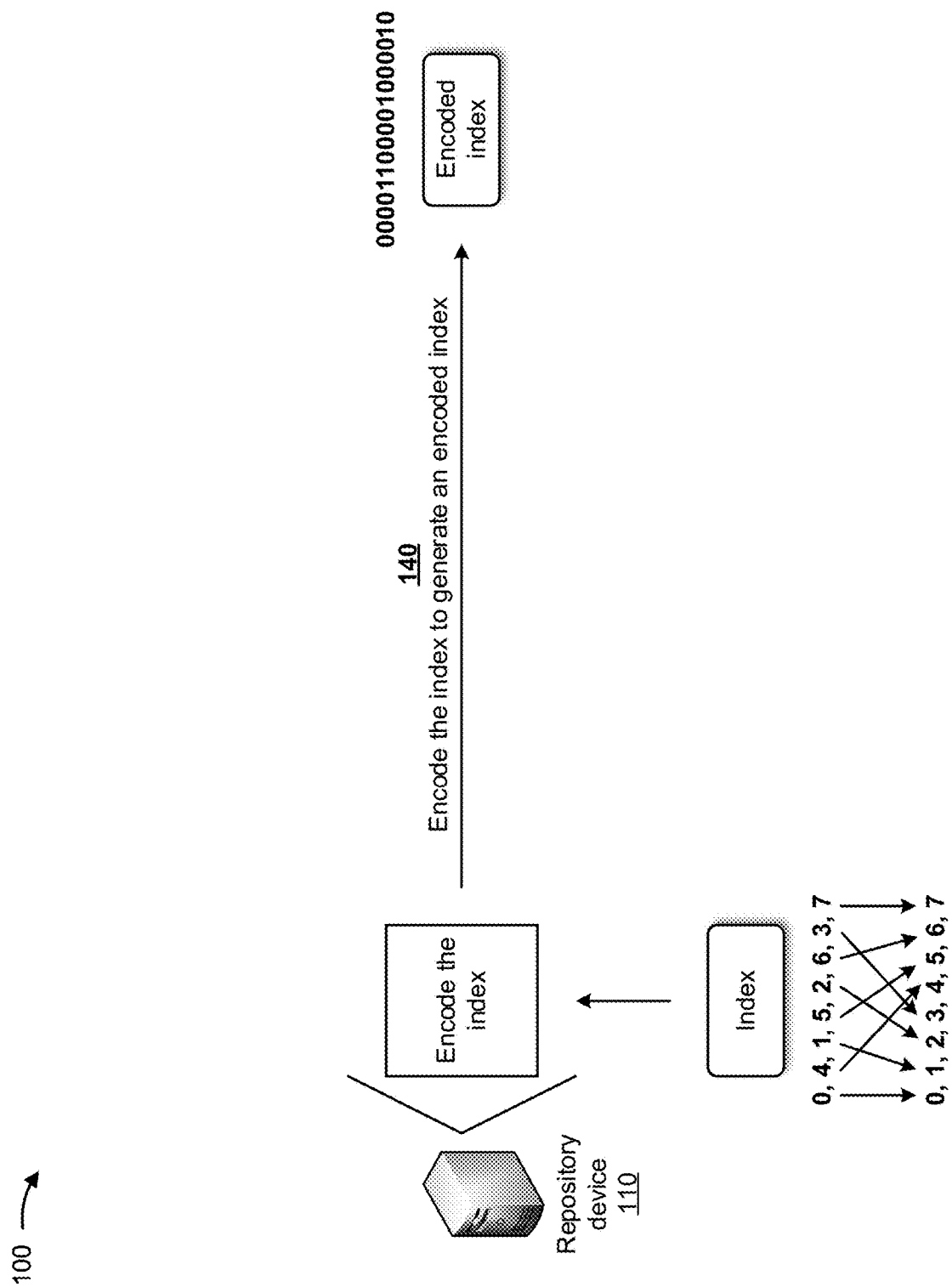
Figure 1F:
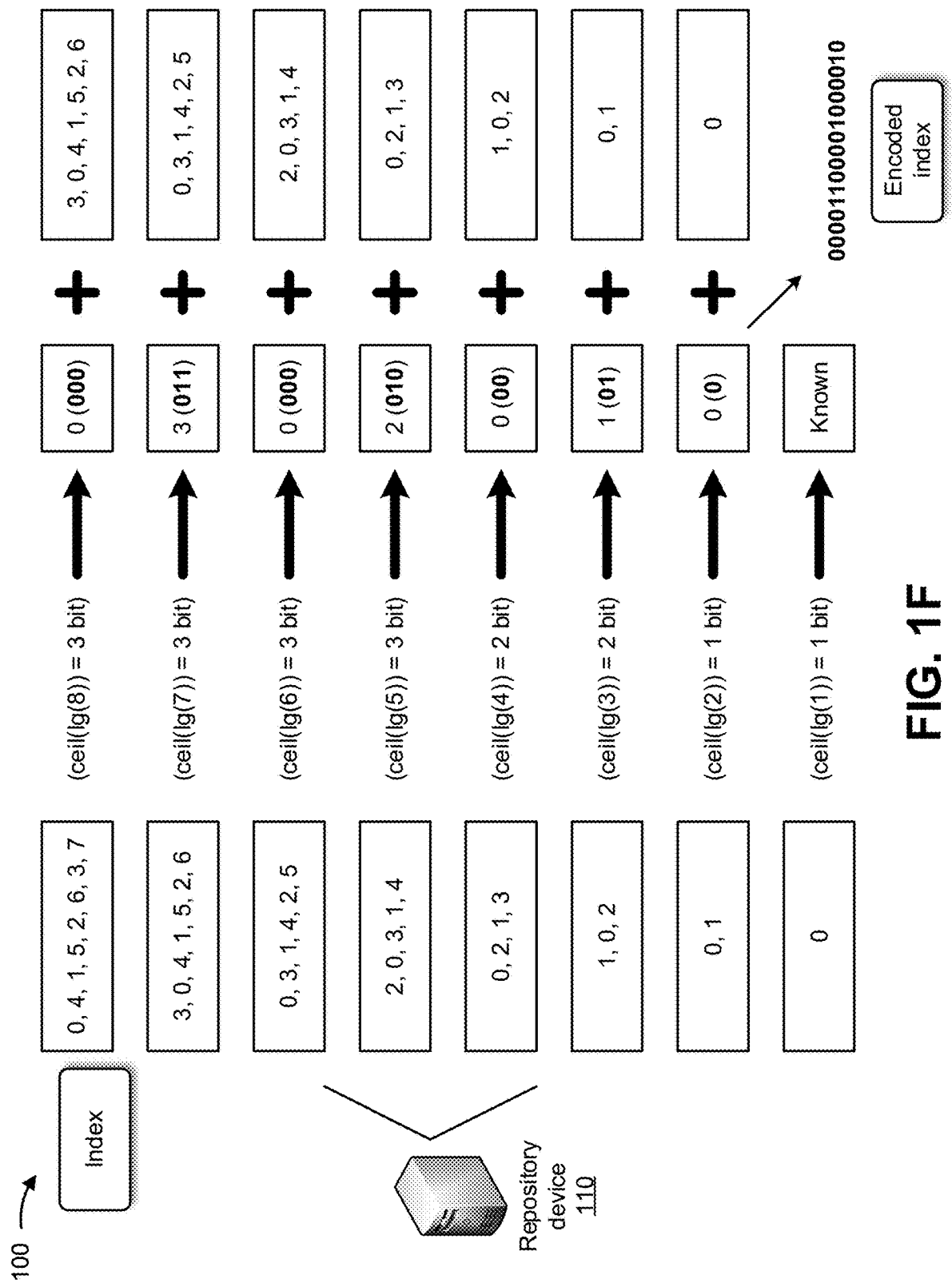
Figure 1G:
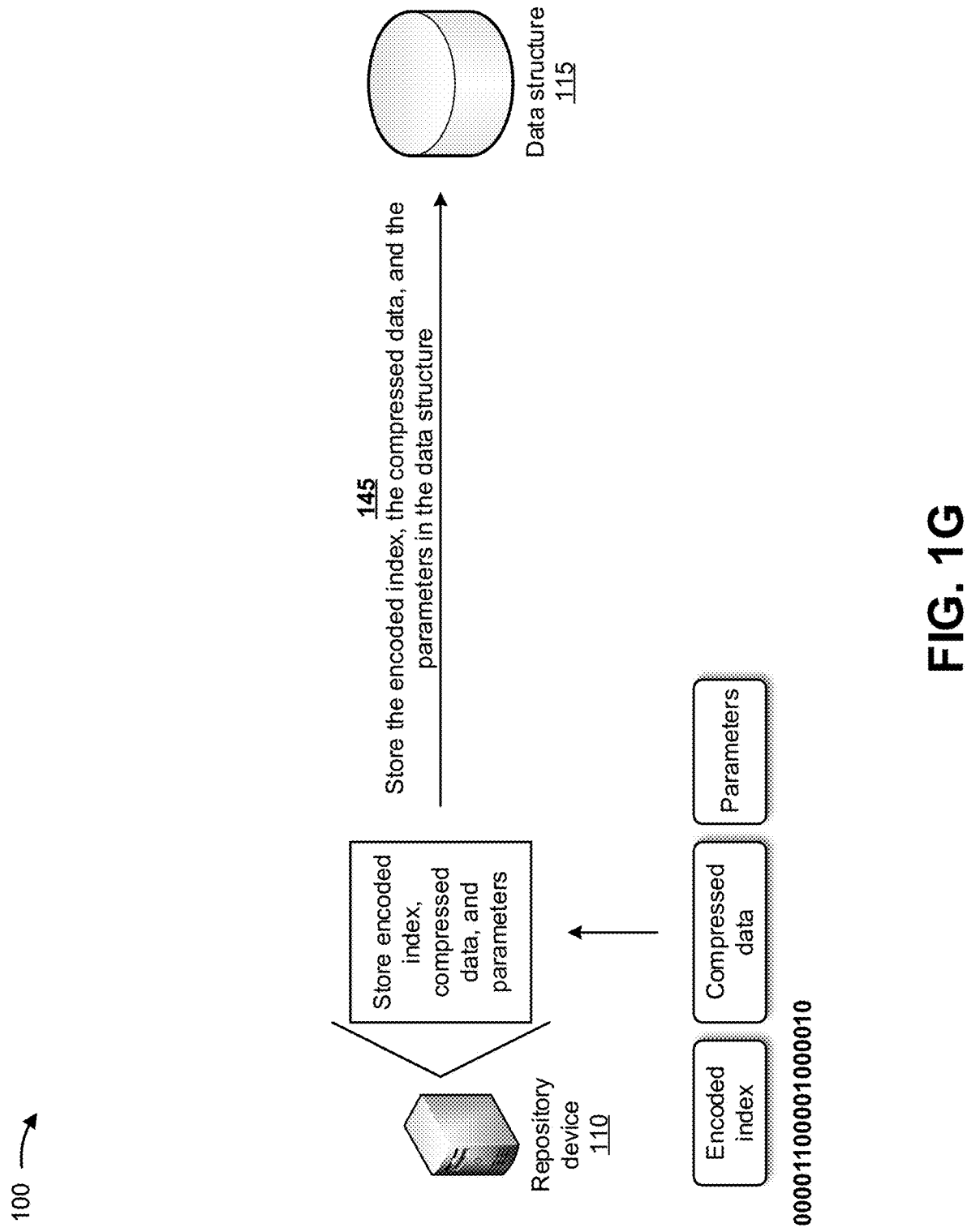
Figure 1I:
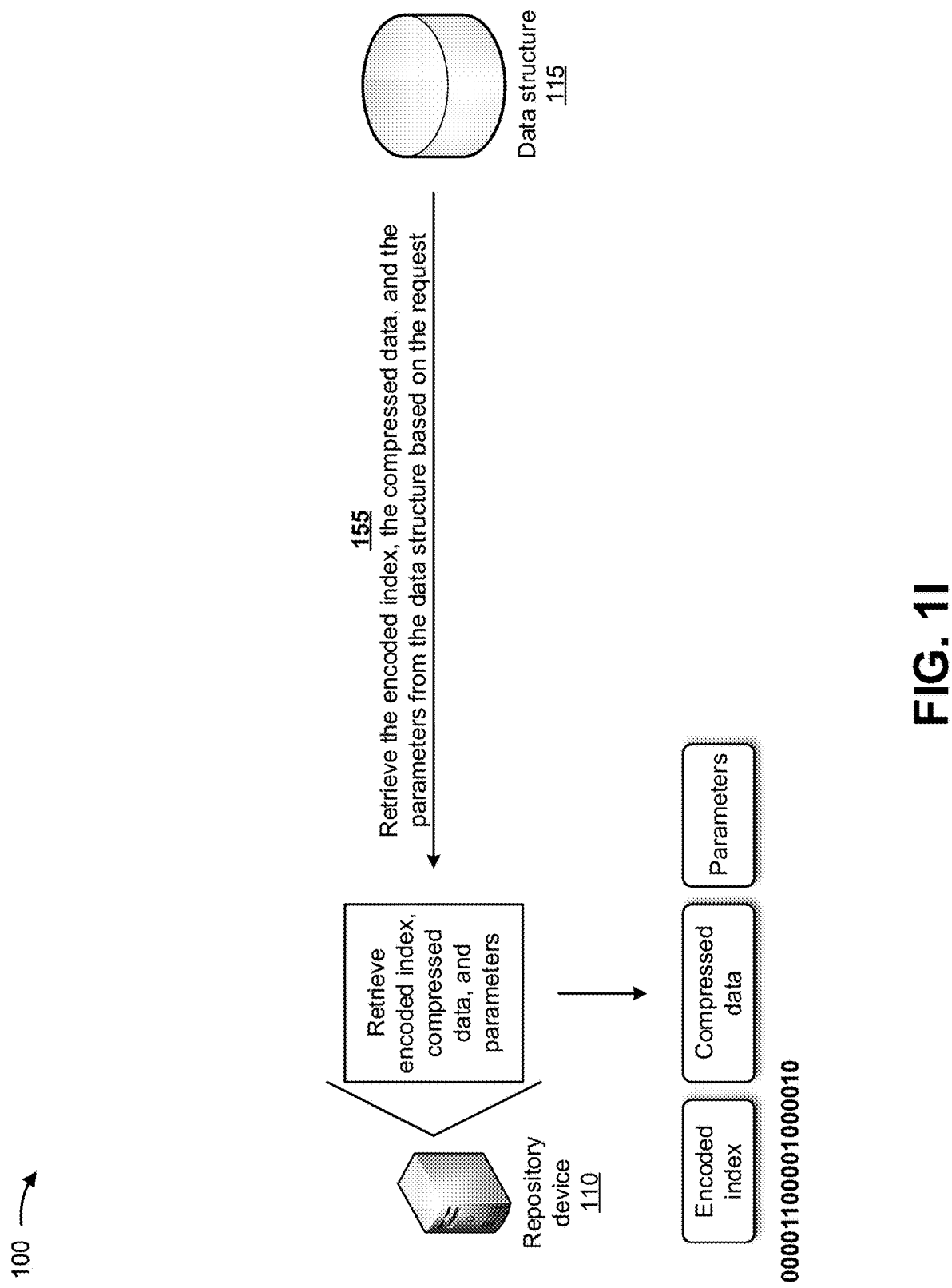
Figure 1J:
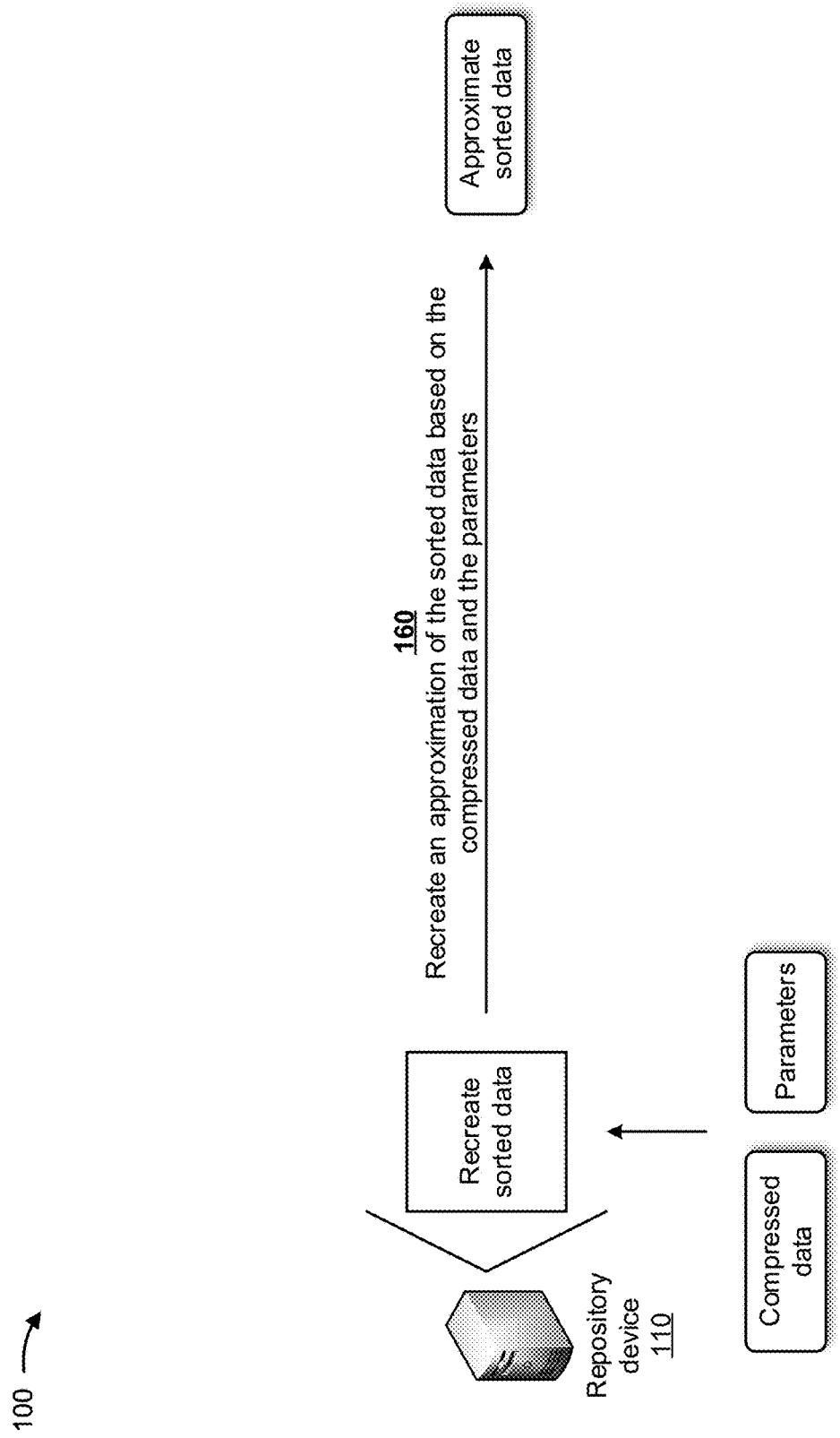
Figure 1K:
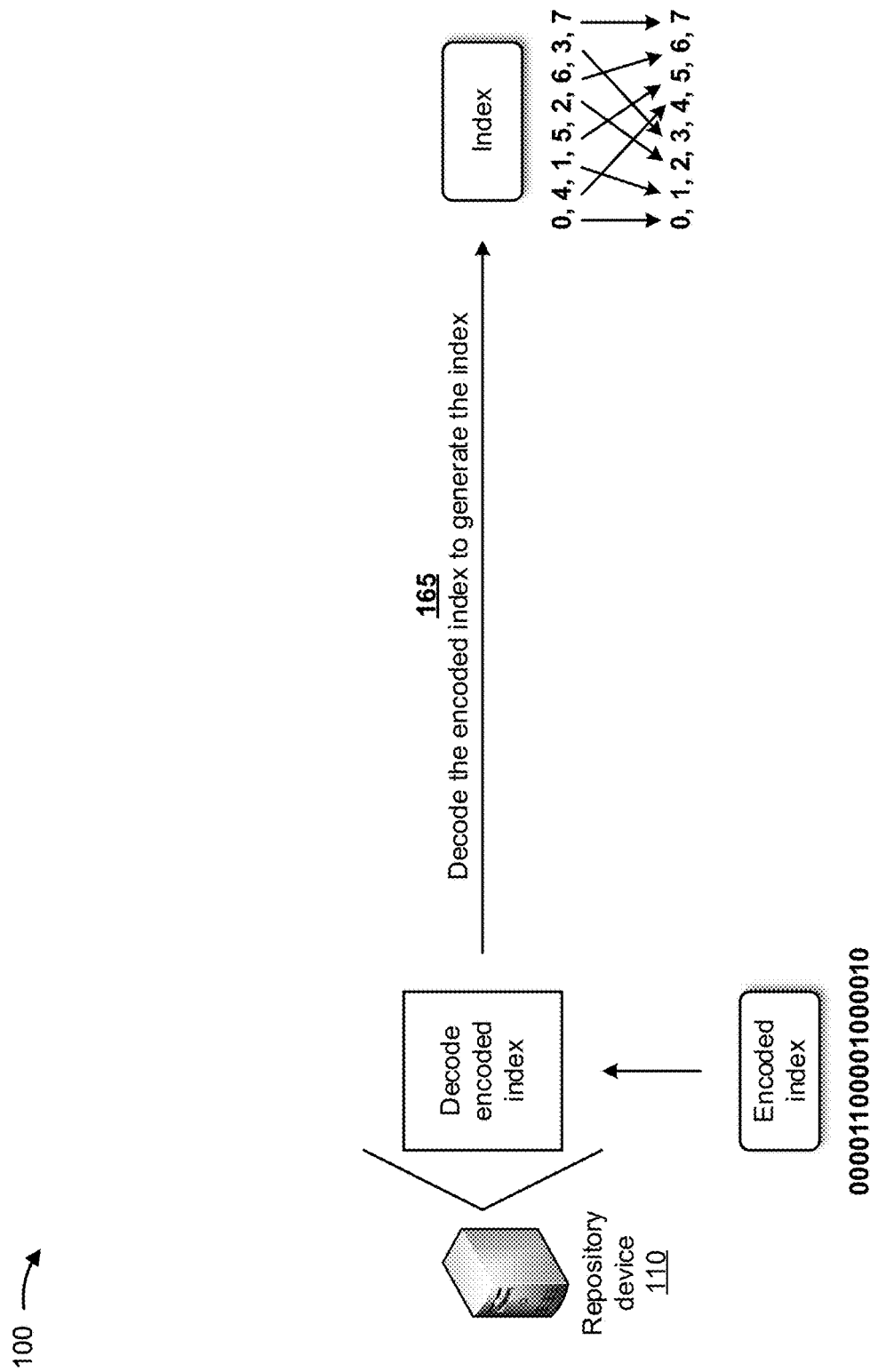
Figure 1L:
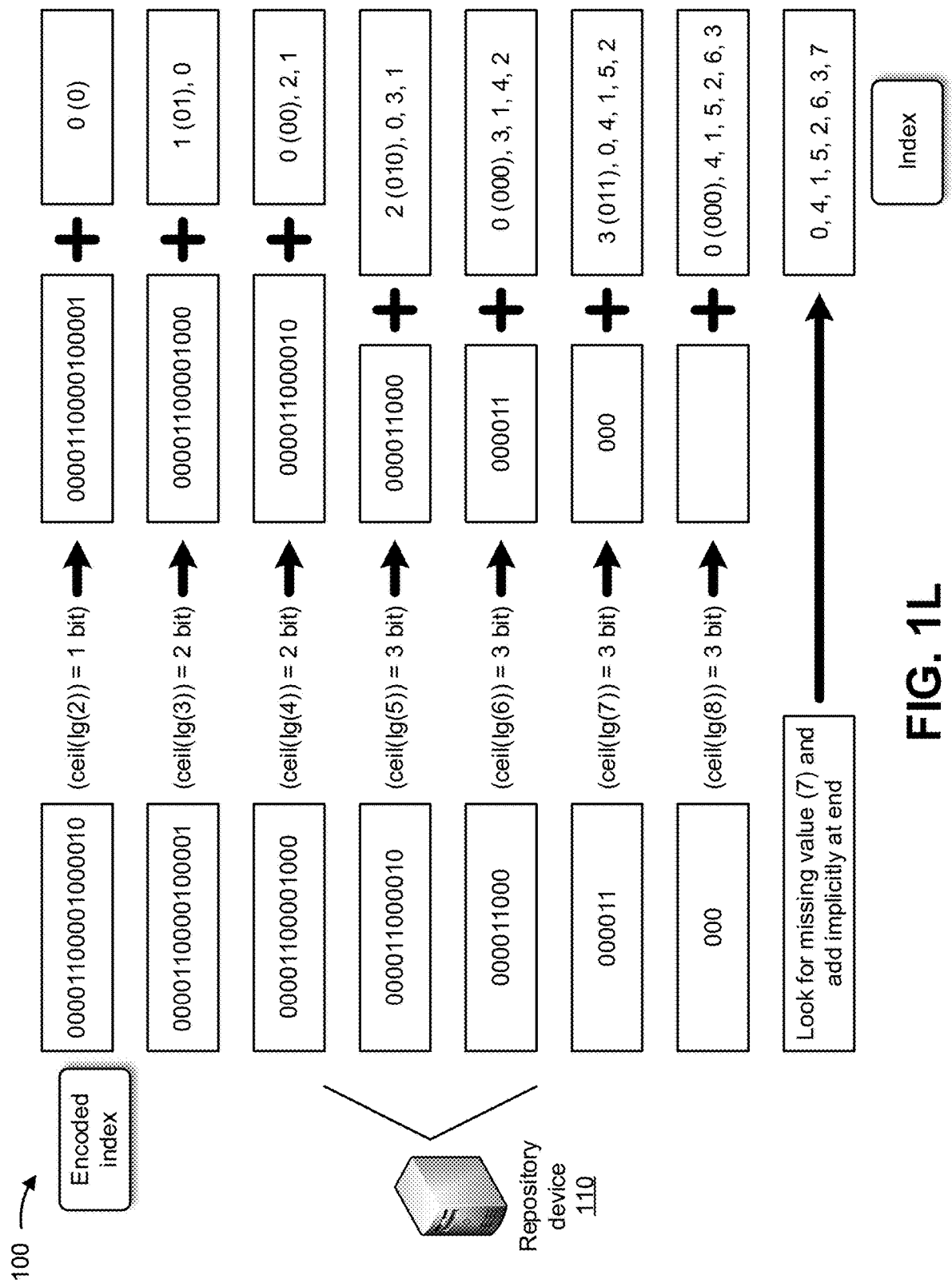
Figure 1M:
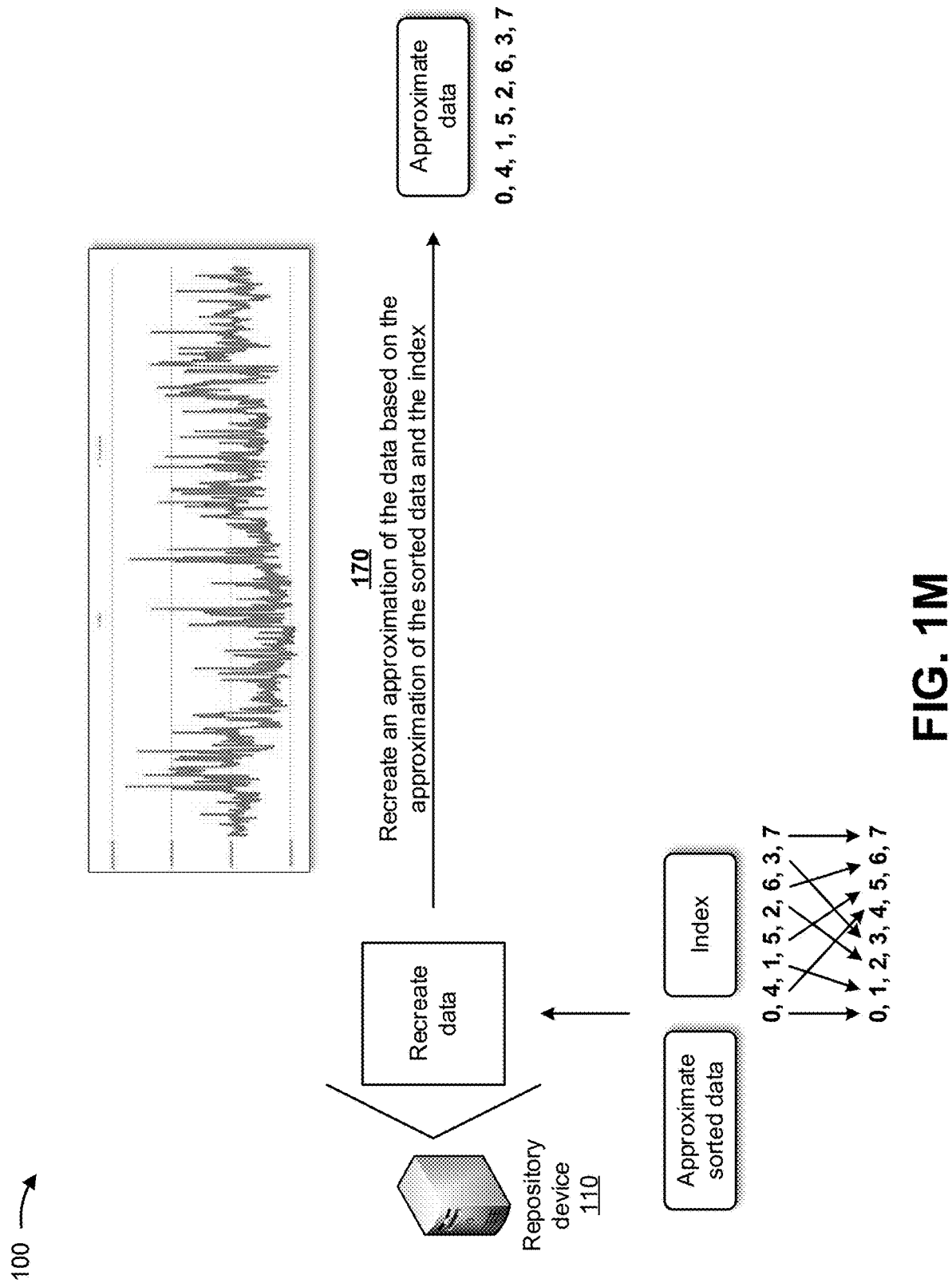
Figure 1N:
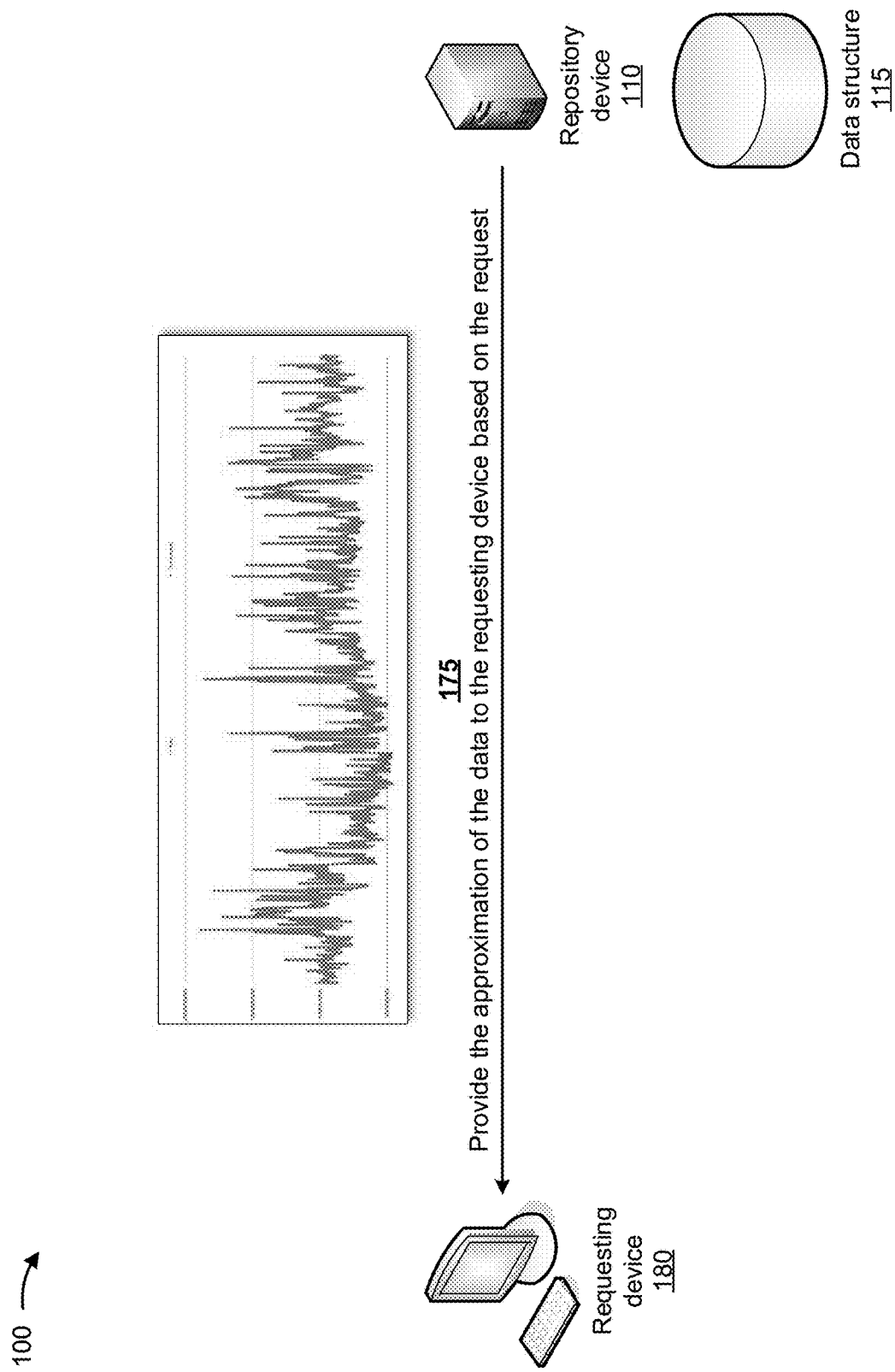

FIGS. 1A-1N are diagrams of one or more example implementations 100 described herein. As shown in FIG. 1A, a source device 105 may be associated with a repository device 110 and a data structure 115. Source device 105 may be any device that provides time series data. Example of a source device may include a mobile device, a computer, a telephone, a set-top box, a sensor, an Internet of Things (IoT) device, a network element device, a computing server and/or the like. Source device 105 may include one or more applications, services or other operational elements that themselves generate time series data. In some implementations, repository device 110 may include a device that performs time series data compression and/or decompression for improved data storage in data structure 115 (e.g., a database, a table, a list, and/or the like).

As further shown in FIG. 1A, and by reference number 120, repository device 110 may receive, from one or more source devices 105 or from other sources (e.g., other repository devices 110, network devices, storage devices, and/or the like), data to be stored in data structure 115. Repository device 110 may periodically receive the data, may continuously receive the data, may receive the data based on a request, and/or the like. The data may include a plurality of elements (e.g., data points that are values in a series of the data) that are time series data. Time series data may include a series of data points indexed in time order. Most commonly, time series data may include a sequence taken at successive equally spaced points in time (e.g., a sequence of discrete-time data). In some implementations, each interval between the elements of the time series data may be lengthy (for example, greater than one second may be lengthy in some environments, such as network elements). In some implementations, the time series data may not be equally spaced in time, but may be otherwise sequential in time. Additionally, or alternatively, the data may include another type of data (e.g., sensor data, network data, and/or the like) that may or may not include time series data. In some implementations, values of the elements may be different from interval to interval.

The received data may be segregated into separate collections for processing by the repository device 110. For example, the data may be representative of a period of time (e.g., 1 hour), a selected source device 105, a selected network in which source device 105 operates, a selected application or service operating on source device 105, or other unit of division. The data segregation may be pre-existing based on how the data is provided to repository device 110 (e.g., source device 105 sends 1 hour of data in each transmission to repository device 110) or may be performed by repository device according to a process it selects (e.g., time blocks, data quantity thresholds, network identifiers, etc.)

As shown in FIG. 1B, and by reference number 125, repository device 110 may apply a compression technique on a collection of original data received from source device 105. The original data may be sorted to generate sorted data and identify an index for the data based on the sorted data. In some implementations, repository device 110 may sort the data from a smallest value of the data in the collection to a largest value of the data in the collection. In such implementations, if the data is time series data, the sorted data may no longer be in time order. The index may provide a mapping from a sorted order of the data to an original order of the data. In some implementations, the index may be a place order index of positive integers starting at place 0 (e.g., 0, 1, 2, 3, . . . N) indicating an ordered location for each element in the sorted data set.

As shown in FIG. 1C, and by reference number 130, repository device 110 may identify a quantity of elements in the data collection. In some implementations, repository device 110 may count each element in the original data or sorted data to determine the quantity of elements in the collection. For example, as shown in FIG. 1C, the data may include eight elements and repository device 110 may identify the quantity of elements in the sorted data as eight. Although eight elements of data are shown herein for illustrative purposes, in practice, the data may include hundreds, thousands, millions, and/or the like of elements and, accordingly, repository device 110 may identify hundreds, thousands, millions, and/or the like of elements in the sorted data.

As shown in FIG. 1D, and by reference number 135, repository device 110 may process the sorted data, with a regression model, to generate compressed data and parameters. In some implementations, the regression model may include a polynomial regression model, a linear regression model, an exponential regression model, and/or the like. In some implementations, the parameters associated with the compressed data may include one or more betas associated with the compressed data, one or more degrees associated with the compressed data, and/or the like. A regression describes a relationship between independent variable (x) and dependent variable (y). A beta zero (e.g., an intercept) may refer to a value of y when x=0, while a beta one (e.g., a regression coefficient referred to as a slope) may refer to the change in variable y when the variable x changes one unit. A degree (e.g., a degree of freedom) in a regression may equal a quantity of observations (or pieces of information) minus a quantity of parameters estimated. In some implementations, when processing the sorted data with the regression model, repository device 110 may generate compressed data that requires less storage size in data structure 115 relative to a delta compression technique.

In some implementations, processing the sorted data using the regression model may include using a machine learning model. For example, a machine learning model may be used to select an appropriate regression model and/or associated parameters. The machine learning model may be trained based on historical data that includes historical sorted data and historical quantities of elements in the historical sorted data. In some implementations, when training the machine learning model, repository device 110 may separate the historical data into a training set, a validation set, a test set, and/or the like. The training set may be utilized to train the machine learning model. The validation set may be utilized to validate results of the trained machine learning model. The test set may be utilized to test operation of the machine learning model.

In some implementations, repository device 110 may train the machine learning model using, for example, an unsupervised training procedure. For example, repository device 110 may perform dimensionality reduction to reduce the historical data to a minimum feature set, thereby reducing resources (e.g., processing resources, memory resources, and/or the like) used to train the machine learning model, and may apply a classification technique to the minimum feature set.

In some implementations, repository device 110 may use a logistic regression classification technique to determine a categorical outcome (e.g., compressed data and parameters). Additionally, or alternatively, repository device 110 may use a naïve Bayesian classifier technique. In this case, repository device 110 may perform binary recursive partitioning to split the historical data into partitions and/or branches and use the partitions and/or branches to determine outcomes (e.g., compressed data and parameters). Based on using recursive partitioning, repository device 110 may reduce utilization of computing resources relative to manual, linear sorting and analysis of data points, thereby enabling use of thousands, millions, or billions of data points to train the machine learning model, which may result in a more accurate model than using fewer data points.

Additionally, or alternatively, repository device 110 may use a support vector machine (SVM) classifier technique to generate a non-linear boundary between data points in the training set. In this case, the non-linear boundary is used to classify test data into a particular class.

Additionally, or alternatively, repository device 110 may train the machine learning model using a supervised training procedure that includes receiving input to the machine learning model from a subject matter expert, which may reduce an amount of time, an amount of processing resources, and/or the like to train the machine learning model relative to an unsupervised training procedure. In some implementations, repository device 110 may use one or more other model training techniques, such as a neural network technique, a latent semantic indexing technique, and/or the like. For example, repository device 110 may perform an artificial neural network processing technique (e.g., using a two-layer feedforward neural network architecture, a three-layer feedforward neural network architecture, and/or the like) to perform pattern recognition with regard to patterns of the historical data. In this case, using the artificial neural network processing technique may improve an accuracy of the trained machine learning model generated by repository device 110 by being more robust to noisy, imprecise, or incomplete data, and by enabling repository device 110 to detect patterns and/or trends undetectable to human analysts or systems using less complex techniques.

In some implementations, rather than training the machine learning model, repository device 110 may receive a trained machine learning model from another device. For example, the other device may generate the trained machine learning model based on having trained the machine learning model in a manner similar to that described above, and may provide the trained machine learning model to repository device 110 (e.g., may pre-load repository device 110 with the trained machine learning model, may receive a request from repository device 110 for the trained machine learning model, may push the trained machine learning model to repository device 110 (without a request from repository device 110), and/or the like).

While processing the sorted data with the regression model in many cases will result in increased compression ratios, it may also result in small amounts of data accuracy loss in the compressed data. In many use cases, such a "lossy" compression that results in minimal data accuracy loss is acceptable. However, where a "lossless" compression is desired, repository device 110 may also determine differences (error) between the original data elements and the compressed data elements (e.g., by comparing the original data elements to the approximation produced by the regression model). In this case, repository device 110 may store the differences data in data structure 115. In some implementations, the differences data may be associated with the compressed data, but stored separately from the compressed data, which may allow for the differences data to be discarded at some future time while allowing the "lossy" compressed data set to be maintained for long term storage, thereby conserving computing resources that would otherwise be wasted in maintaining the lossless data set longer than needed.

As shown in FIG. 1E, and by reference number 140, repository device 110 may encode the index to generate an encoded index. Encoding the index may provide further compression ratio improvements by reducing the amount of storage needed to store the index (which may be mapping millions of elements). In some implementations, repository device 110 may encode the index into a binary value that represents the index values. In some implementations, repository device 110 may encode the index by applying a process as shown in FIG. 1F.

As shown in FIG. 1F, the index may be encoded with a lossless encoding process that compresses the size of the index while retaining the ability to accurately recreate the index. In some implementations this encoding process may convert the individual index values to binary representations, and further compress the resulting binary values using additional techniques. One such technique applies a reducer function to reduce the maximum possible values in the remaining values, which allows for reduced bit-size storage as each value is added to the encoded index. FIG. 1F illustrates this technique in an example eight element data set, having index values in the range 0-7. Beginning with all eight index value numbers of the index (e.g., 0, 4, 1, 5, 2, 6, 3, 7), repository device 110 may encode a first number (0) of the eight numbers into a binary value having a bit-size large enough to accommodate the highest possible index value in the series—in this example, a three-bit binary value, because three bits would be needed to represent the highest possible index value in an eight-element (zero-indexed) set (7, or binary 111). Thus, the first number "0" is encoded as "000" and appended to the encoded index. The reducer function may then be applied to subtract one from each of the remaining index value numbers in the index (4, 1, 5, 2, 6, 3, 7) that has a value greater than the encoded number (0), to produce a remaining series of numbers (3, 0, 4, 1, 5, 2, 6) to which the process is applied again. Repository device 110 may encode a first number (3) of the next series into another three-bit binary value (011), append the binary value to the end of the encoded index, and may then apply the reducer function to subtract one from each of the remaining numbers (0, 4, 1, 5, 2, 6) that has a value greater than the encoded number (3), to produce a next series of index value numbers (0, 3, 1, 4, 2, 5). Repository device 110 may continue the process until only one number (0) remains in the index series. In some implementations, the last 0 value may be omitted from the encoded index, since the last value of the index encoding process will always be 0. In still some other implementations, the first value in the series may be completely omitted prior to encoding, while retaining the encodings for all other values. Using this convention, the encoded index from the example of FIG. 1F is represented as binary "00001100001000010."

As shown in FIG. 1G, and by reference number 145, repository device 110 may store the encoded index, the compressed data, and the parameters in data structure 115. In those implementations where repository device 110 may determine differences data between the original data and the compressed data, repository device 110 may store the differences data in data structure 115 separately from the compressed data. Repository device 110 may also store non-time series information associated with the time series data, such as time periods represented by the data set, source information, and the like.

As shown in FIG. 1H, and by reference number 150, repository device 110 may receive, from a requesting device 180, a request for the data stored in data structure 115. In some implementations, requesting device 180 may also be a source device 105 that provided the data to repository device 110, or it may be a separate device from source device 105. For example, a user of requesting device 180 may wish to review the data stored in data structure 115 generated by one of more source devices 105 (e.g., to perform performance analysis, forensic investigation, and the like), and may request the data generated from the source devices 105. In some implementations, the request may specify a time period associated with the data stored in data structure (e.g., data between 12:00 and 15:00 on 01/01/2020) and a data source 105 that generated the data.

As shown in FIG. 1I, and by reference number 155, repository device 110 may retrieve the compressed data corresponding to the request. In some implementations, the request may include information that identifies the data (e.g., a time period specifying a range of the data, a range of the data, identifiers associated with the data, and/or the like), and data structure 115 may associate the encoded index, the compressed data, and the parameters with the information that identifies the data. Repository device 110 may utilize the information that identifies the data to locate and extract the encoded index, the compressed data, and the parameters from data structure 115. In some implementations, the repository device 110 may also retrieve compression differences data.

As shown in FIG. 1J, and by reference number 160, repository device 110 may generate an approximation of the sorted data based on the compressed data and the parameters. In some implementations, repository device 110 may process the compressed data, with the regression model (e.g., described above with respect to FIG. 1D) and based on the parameters, to generate the approximation of the sorted data. In some implementations, repository device 110 may process the compressed data, with a reverse regression model and based on the parameters, to generate the approximation of the sorted data.

As shown in FIG. 1K, and by reference number 165, repository device 110 may decode the encoded index to generate the index. For example, repository device 110 may decode the encoded index, from the binary value, into the original index (e.g., the mapping of the time order of the data). In some implementations, repository device 110 may decode the index by applying a process as shown in FIG. 1L.

As shown in FIG. 1L, repository device 110 may decode the index by applying a process that reverses the encoding process described above with respect to FIG. 1F. Starting with the binary value of the encoded index (e.g., 00001100001000010), repository device 110 may extract a number of end bits corresponding to the bit size needed to represent the place value in the index. For example, the second place value in the index would use 1 bit (1), the third place in the index would use 2 bits (10), the fourth place in the index would use 2 bits (11), the fifth place in the index would use 3 bits (100), and so forth. In systems where the final 0 of the encoded index is not included in the encoded index (see FIG. 1F above), the first retrieved value from the encoded index will be the second index place value. The repository device 110 may extract this second place value from the encoded index as a 1 bit value (0), may decode the extracted bit, and may generate a value (0) based on decoding the extracted bit and add this value to the decoded index series set (0). Repository device 110 may extract a next (third place) value from the end of the remaining encoded index using the rightmost two bits (01), may decode the extracted bits, and may generate a value (1) based on decoding the extracted bits. Repository device 110 may then apply an inverse of the reducing function by adding one to each current number in the decoded index series (0), that has a value that is not less than the generated value (1), and then add the generated value to the front of decoded index series to produce the next series (1, 0). Repository device 110 may then extract a next (fourth place) value from the remaining encoded index using rightmost two bits (00), may decode the extracted bits, and may generate a value (0) based on decoding the extracted bits. Repository device 110 may then apply the inverse reducing function to add one to each current number in the series (1, 0) that has a value that is not less than the generated value (0), and then append the generated value to the front of the decoded index series to produce the next series (0, 2, 1). Repository device 110 may continue the process until all bits of the encoded index have been extracted and decoded to generate a series of decoded index numbers (0, 4, 1, 5, 2, 6, 3). Using this encoding technique, the final index number in the series will be missing, but can be determined by analysis of the current series for the one value missing from an index of the size expected. In this case of an eight element data set, the index should have values 0-7, and the missing index value is 7. The value 7 is appended to the end of the decoded index series, resulting in a decoded index of "0, 4, 1, 5, 2, 6, 3, 7" (matching the index used in the encoding of FIG. 1F).

As shown in FIG. 1M, and by reference number 170, repository device 110 may generate an approximation of the original data based on the sorted data and the index. In some implementations, repository device 110 may utilize the index to re-sort the sorted data into its original order and generate the approximation of the original data.

As shown in FIG. 1N, and by reference number 175, repository device 110 may respond to requesting device 180 with a responsive data set. In some implementations, the responsive data set will include the approximation of the original data. In some implementations, the responsive data set may include the differences data identified between the original data and the compressed data. In some implementations, the differences data may be applied to the approximation of the original data to recreate the original data, and the recreated original data set is sent as the responsive data set to requesting device 180. In some implementations, the approximated data and the differences data may be sent separately to allow requesting device 180 the option to apply the differences data to the approximations. In some implementations, repository device 110 may generate a user interface that includes the approximation of the data with the differences superimposed on the approximation of the data. This may enable a user of requesting device 180 to see how close the approximation of the data is to the original data.

In this way, repository device 110 may store data in a significantly compressed manner while also providing the data when requested in a manner that is very close (or identical) to the original data.

As described herein, several different stages of the process for enhancing data compression (e.g., time series data compression) for improved data storage are improved, which may remove waste from the process, and which may improve speed and efficiency of the process and conserve computing resources (e.g., processing resources, memory resources, communication resources, and/or the like), networking resources, and/or the like. Furthermore, implementations described herein use a computerized process to perform tasks that are not reasonably performed by human actors. Finally, the process for enhancing time series data compression for improved data storage conserves computing resources, networking resources, and/or the like that would otherwise have been wasted in storing large quantities of data, processing large quantities of data, and/or the like using a less efficient technique.

As indicated above, FIGS. 1A-1N are provided merely as examples. Other examples may differ from what was described with regard to FIGS. 1A-1N. The number and arrangement of devices and networks shown in FIGS. 1A-1N are provided as an example. In practice, there may be additional devices and/or networks, fewer devices and/or networks, different devices and/or networks, or differently arranged devices and/or networks than those shown in FIGS. 1A-1N. Furthermore, two or more devices shown in FIGS. 1A-1N may be implemented within a single device, or a single device shown in FIGS. 1A-1N may be implemented as multiple, distributed devices. Additionally, or alternatively, a set of devices (e.g., one or more devices) of FIGS. 1A-1N may perform one or more functions described as being performed by another set of devices of FIGS. 1A-1N.

Figure 2:
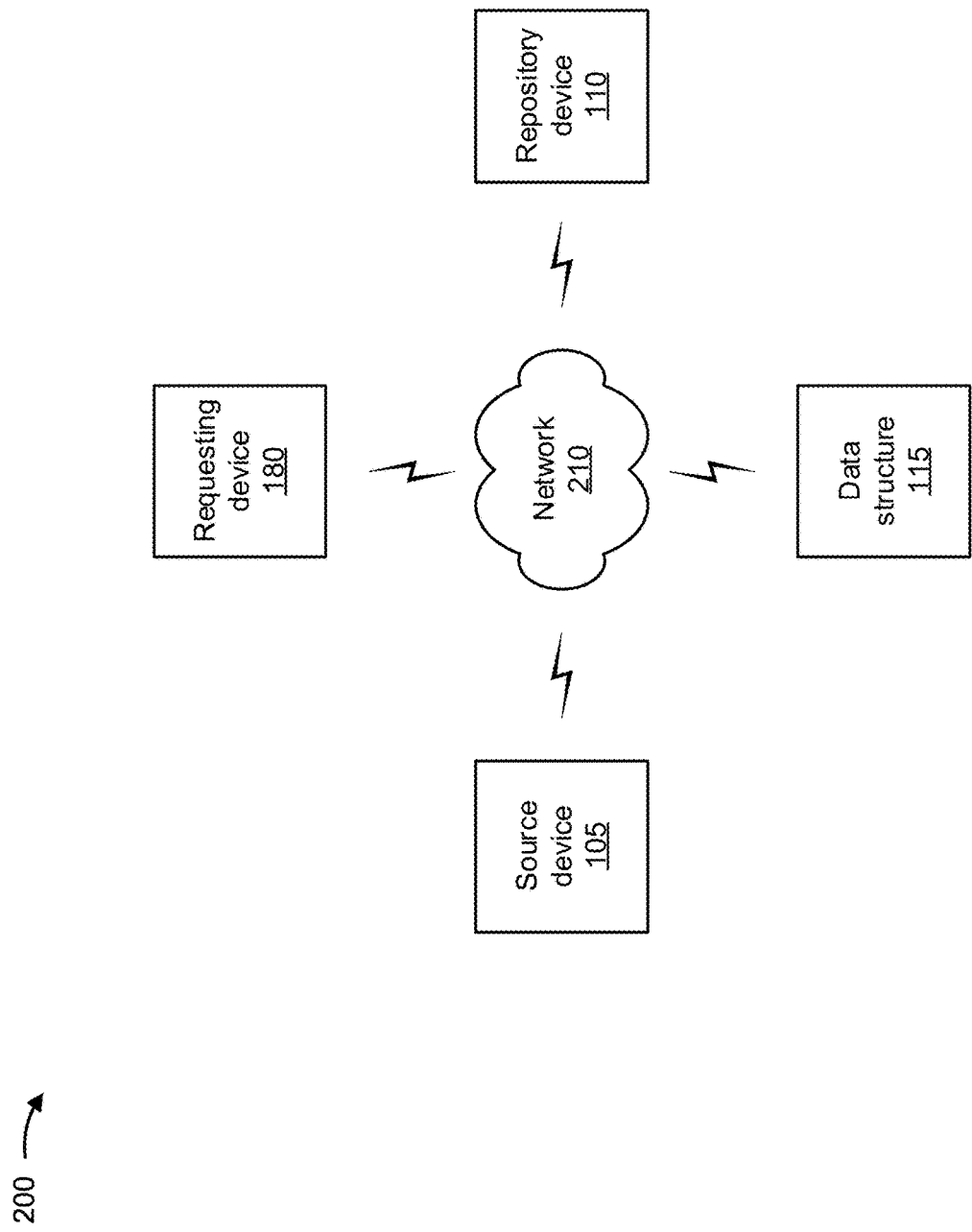
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include source device 105, repository device 110, data structure 115, requesting device 180, and a network 210. Devices of environment 200 may interconnect via wired connections, wireless connections, or a combination of wired and wireless connections.

Source devices 105 include one or more devices capable of receiving, generating, storing, processing, and/or providing information, such as information described herein. For example, source device 105 may include a mobile phone (e.g., a smart phone, a radiotelephone, and/or the like), a laptop computer, a tablet computer, a desktop computer, a handheld computer, a gaming device, a wearable communication device (e.g., a smart watch, a pair of smart glasses, a heart rate monitor, a fitness tracker, smart clothing, smart jewelry, a head mounted display, and/or the like), a sensor device, an Internet of Things (IoT) device, a network element (e.g., switch, router, firewall, IDS, gateway, virtualized devices, etc.), a data center element (e.g., server, load balancer, proxy, virtualized devices, etc.) or a similar type of device. In some implementations, source device 105 may receive information from and/or transmit information to repository device 110 and/or data structure 115.

Repository device 110 and requesting device 180 include one or more devices capable of receiving, generating, storing, processing, and/or providing information, as described herein. For example, repository device 110 and/or requesting device 180 may include a laptop computer, a tablet computer, a desktop computer, a group of server devices, or a similar type of device. In some implementations, repository device 110 may receive information from and/or transmit information to source device 105, requesting device 180 and/or data structure 115. In some implementations, requesting device 110 may receive information from and/or transmit information to source device 105, repository device 180 and/or data structure 115.

In some implementations, repository device 110 may be designed to be modular such that certain software components may be swapped in or out depending on a particular need. As such, repository device 110 may be easily and/or quickly reconfigured for different uses. In some implementations, repository device 110 may be hosted in a cloud computing environment, may not be cloud-based (i.e., may be implemented outside of a cloud computing environment), or may be partially cloud-based.

Data structure 115 includes one or more storage devices capable of receiving, generating, storing, processing, and/or providing information, such as information described herein. For example, data structure 115 may include a data warehouse, a database engine, a database, a data repository, a data center, a cloud computing resource, a table, a list, and/or the like. In some implementations, data structure 115 may receive information from and/or transmit information to source device 105, requesting device 180 and/or repository device 110.

Network 210 includes one or more wired and/or wireless networks. For example, network 210 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or the like, and/or a combination of these or other types of networks. In some implementations, network 210 may receive information from and/or transmit information to source device 105 and/or repository device 110.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
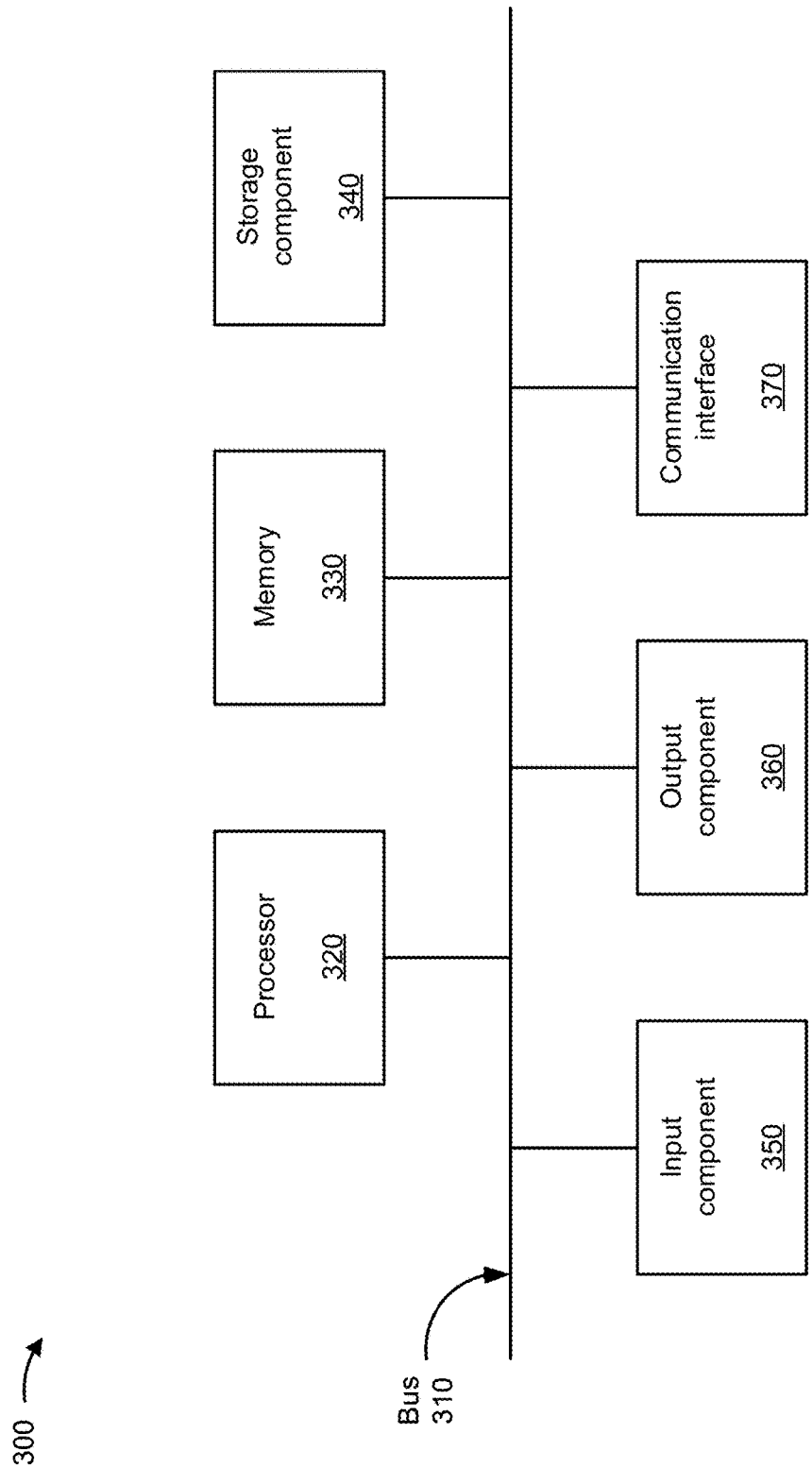
FIG. 3 is a diagram of example components of one or more devices of FIG. 2.

FIG. 3 is a diagram of example components of a device 300. Device 300 may correspond to source device 105, repository device 110, and/or requesting device 180. In some implementations, source device 105, repository device 110, and/or requesting device 180 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random-access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid-state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
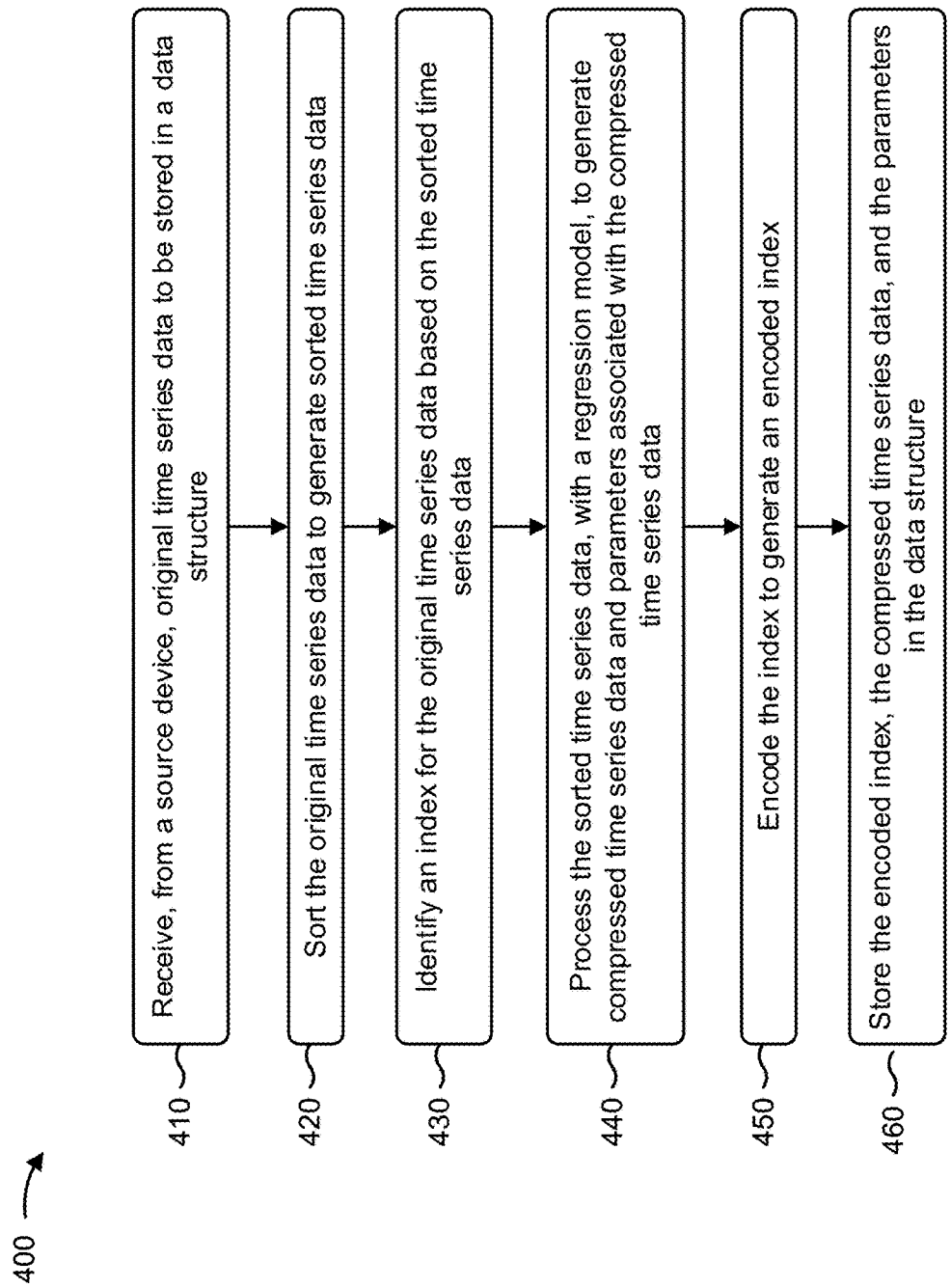
FIG. 4 is a flow chart of an example process for enhancing time series data compression for improved data storage.

FIG. 4 is a flow chart of an example process 400 for enhancing time series data compression for improved data storage and retrieval. In some implementations, one or more process blocks of FIG. 4 may be performed by a device (e.g., repository device 110). In some implementations, one or more process blocks of FIG. 4 may be performed by another device or a group of devices separate from or including the device, such as a source device (e.g., source device 105).

As shown in FIG. 4, process 400 may include receiving, from a source device, original time series data to be stored in a data structure (block 410). For example, the device (e.g., using processor 320, communication interface 370, and/or the like) may receive, from a source device, original time series data to be stored in a data structure, as described above.

As further shown in FIG. 4, process 400 may include sorting the original time series data to generate sorted time series data (block 420). For example, the device (e.g., using processor 320, memory 330, and/or the like) may sort the time series data to generate sorted time series data, as described above. Sorting of the original time series data may result in at least a portion of the time series data no longer being arranged in time series order. In some implementations, sorting the original time series data to generate the sorted time series data may include sorting the original time series data such that at least a portion of the sorted time series data is no longer in time series order.

As further shown in FIG. 4, process 400 may include identifying an index for the original time series data based on the sorted time series data (block 430). For example, the device (e.g., using processor 320, storage component 340, and/or the like) may identify an index for the original time series data based on the sorted time series data, as described above, such that the index may be used to map the sorted data to the original time series data. In some implementations, the index may include an original order of the time series data.

As further shown in FIG. 4, process 400 may include processing the sorted time series data, with a regression model, to generate compressed time series data and parameters associated with the compressed time series data (block 440). For example, the device (e.g., using processor 320, memory 330, storage component 340, and/or the like) may process the sorted time series data, with a regression model, to generate compressed time series data and parameters associated with the compressed time series data, as described above. The regression model may include a polynomial regression model, a linear regression model, an exponential regression model, and/or the like. The parameters associated with the compressed time series data may include one or more betas associated with the compressed time series data, one or more degrees associated with the compressed time series data, and/or the like. In some implementations, processing the sorted time series data with the regression model includes applying a machine learning model to select at least one of an appropriate regression model and associated parameters.

As further shown in FIG. 4, process 400 may include encoding the index to generate an encoded index (block 450). For example, the device (e.g., using processor 320, storage component 340, and/or the like) may encode the index to generate an encoded index, as described above.

As further shown in FIG. 4, process 400 may include storing the encoded index, the compressed time series data, and the parameters in the data structure (block 460). For example, the device (e.g., using processor 320, memory 330, storage component 340, communication interface 370, and/or the like) may store the encoded index, the compressed time series data, and the parameters in the data structure, as described above.

Process 400 may include additional implementations, such as any single implementation or any combination of implementations described above, below, and/or in connection with one or more other processes described elsewhere herein.

In some implementations, process 400 may include determining differences data between the original time series data and the compressed time series data, and storing the differences data in the data structure associated with the compressed time series data. In some implementations, the differences data may be stored separately from the compressed time series data.

In some implementations, process 400 may include receiving a request for the original time series data; retrieving the encoded index, the compressed time series data, and the parameters from the data structure based on the request; generating an approximation of the sorted time series data based on the compressed time series data and the parameters; decoding the encoded index to recreate the index; and applying the index to the approximation of the sorted time series data to generate an approximation of the original time series data.

In some implementations, process 400 may include decoding the encoded index to generate the original index, and using the original index to generate an approximation of the original time series data by re-sorting the approximation of the sorted time series data into a time ordered series.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

To the extent the aforementioned implementations collect, store, or employ personal information of individuals, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
   receiving, by a device and from a source device, original time series data to be stored in a data structure associated with the device;
   sorting, by the device, the original time series data to generate sorted time series data;
   identifying, by the device, an index for the original time series data based on the sorted time series data;
   processing, by the device, the sorted time series data, with a regression model, to generate compressed time series data and parameters associated with the compressed time series data;
   encoding, by the device, the index to generate an encoded index;
   storing, by the device, the encoded index, the compressed time series data, and the parameters in the data structure;
   receiving a request for the original time series data;
   retrieving the encoded index, the compressed time series data, and the parameters from the data structure based on the request;
   generating an approximation of the sorted time series data based on the compressed time series data and the parameters;
   decoding the encoded index to recreate the index; and
   applying the index to the approximation of the sorted time series data to generate an approximation of the original time series data.

2. The method of claim 1, wherein sorting the original time series data to generate the sorted time series data comprises:
   sorting the original time series data such that at least a portion of the sorted time series data is no longer in time series order.

3. The method of claim 1, wherein the regression model includes one of:
   a polynomial regression model,
   a linear regression model, or
   an exponential regression model.

4. The method of claim 1, wherein the parameters associated with the compressed time series data include one or more of:
   one or more betas associated with the compressed time series data, or
   one or more degrees associated with the compressed time series data.

5. The method of claim 1, wherein processing the sorted time series data with a regression model includes applying a machine learning model to select at least one of an appropriate regression model and associated parameters.

6. The method of claim 1, further comprising:
   determining differences data between the original time series data and the compressed time series data; and
   storing the differences data in the data structure associated with the compressed time series data.

7. The method of claim 6, further comprising:
   retrieving the differences data from the data structure based on the request;
   applying the differences data to the approximation of the sorted time series data to generate the sorted time series data; and
   applying the index to the sorted time series data to generate the original time series data.

8. The method of claim 6, further comprising:
   subsequent to storing the differences data, discarding the differences data while retaining the compressed time series data.

9. The method of claim 1, wherein encoding the index includes applying a binary encoding process to the index, and wherein the binary encoding process includes:
   a. reading an index value from a front of index;
   b. encoding the index value as a binary value with a bit size as large as would be needed to represent the largest index value in the index;
   c. appending the encoded index value to an end of the encoded index;
   d. removing the index value from the index, and subtracting one from any index value remaining in the index that is larger than the index value; and e. repeating steps a-d until all index values in the index have been processed.

10. A method comprising:
receiving, by a device and from a source device, original time series data to be stored in a data structure associated with the device;
sorting, by the device, the original time series data to generate sorted time series data;
identifying, by the device, an index for the original time series data based on the sorted time series data;
processing, by the device, the sorted time series data, with a regression model, to generate compressed time series data and parameters associated with the compressed time series data;
encoding, by the device, the index to generate an encoded index;
storing, by the device, the encoded index, the compressed time series data, and the parameters in the data structure;
determining differences data between the original time series data and the compressed time series data; and
storing the differences data in the data structure associated with the compressed time series data.

11. The method of claim 10, further comprising:
receiving a request for the original time series data;
retrieving the encoded index, the compressed time series data, the parameters and the differences data from the data structure based on the request;
generating an approximation of the sorted time series data based on the compressed time series data and the parameters;
applying the differences data to the approximation of the sorted time series data to generate the sorted time series data;
decoding the encoded index to recreate the index; and
applying the index to the sorted time series data to generate the original time series data.

12. The method of claim 10, further comprising:
subsequent to storing the differences data, discarding the differences data while retaining the compressed time series data.

13. The method of claim 10, wherein sorting the original time series data to generate the sorted time series data comprises:
sorting the original time series data such that at least a portion of the sorted time series data is no longer in time series order.

14. The method of claim 10, wherein the regression model includes one of:
a polynomial regression model,
a linear regression model, or
an exponential regression model.

15. The method of claim 10, wherein the parameters associated with the compressed time series data include one or more of:
one or more betas associated with the compressed time series data, or
one or more degrees associated with the compressed time series data.

16. The method of claim 10, wherein processing the sorted time series data with a regression model includes applying a machine learning model to select at least one of an appropriate regression model and associated parameters.

17. The method of claim 10, comprising:
wherein encoding the index includes applying a binary encoding process to the index, and
wherein the binary encoding process includes:
a. reading an index value from a front of index;
b. encoding the index value as a binary value with a bit size as large as would be needed to represent the largest index value in the index;
c. appending the encoded index value to an end of the encoded index;
d. removing the index value from the index, and subtracting one from any index value remaining in the index that is larger than the index value; and
e. repeating steps a-d until all index values in the index have been processed.

18. A method comprising:
receiving, by a device and from a source device, original time series data to be stored in a data structure associated with the device;
sorting, by the device, the original time series data to generate sorted time series data;
identifying, by the device, an index for the original time series data based on the sorted time series data;
processing, by the device, the sorted time series data, with a regression model, to generate compressed time series data and parameters associated with the compressed time series data;
encoding, by the device, the index to generate an encoded index; and
storing, by the device, the encoded index, the compressed time series data, and the parameters in the data structure;
wherein encoding the index includes applying a binary encoding process to the index, and
wherein the binary encoding process includes:
a. reading an index value from a front of index;
b. encoding the index value as a binary value with a bit size as large as would be needed to represent the largest index value in the index;
c. appending the encoded index value to an end of the encoded index;
d. removing the index value from the index, and subtracting one from any index value remaining in the index that is larger than the index value; and
e. repeating steps a-d until all index values in the index have been processed.

19. The method of claim 18, wherein sorting the original time series data to generate the sorted time series data comprises:
sorting the original time series data such that at least a portion of the sorted time series data is no longer in time series order.

20. The method of claim 18, wherein the regression model includes one of:
a polynomial regression model,
a linear regression model, or
an exponential regression model.

21. The method of claim 18, wherein the parameters associated with the compressed time series data include one or more of:
one or more betas associated with the compressed time series data, or
one or more degrees associated with the compressed time series data.

22. The method of claim 18, wherein processing the sorted time series data with a regression model includes applying a machine learning model to select at least one of an appropriate regression model and associated parameters.

23. The method of claim 18, further comprising:
determining differences data between the original time series data and the compressed time series data;

storing the differences data in the data structure associated with the compressed time series data; and subsequent to storing the differences data, discarding the differences data while retaining the compressed time series data.

24. The method of claim 18, further comprising:

determining differences data between the original time series data and the compressed time series data;

storing the differences data in the data structure associated with the compressed time series data;

receiving a request for the original time series data;

retrieving the encoded index, the compressed time series data, the parameters and the differences data from the data structure based on the request;

generating an approximation of the sorted time series data based on the compressed time series data and the parameters;

applying the differences data to the approximation of the sorted time series data to generate the sorted time series data;

decoding the encoded index to recreate the index; and applying the index to the sorted time series data to generate the original time series data.

\* \* \* \* \*